(12) United States Patent
Han

(10) Patent No.: US 8,248,767 B2
(45) Date of Patent: Aug. 21, 2012

(54) PROTECTIVE COVER ASSEMBLY FOR ELECTRONIC DEVICE

(75) Inventor: De-Zhi Han, Shenzhen (CN)

(73) Assignees: Shenzhen Futaihong Precision Industry Co., Ltd., Shenzhen, Guangdong Province (CN); FIH (Hong Kong) Limited, Kowloon (HK)

( * ) Notice: Subject to any disclaimer, the term of this patent is extended or adjusted under 35 U.S.C. 154(b) by 151 days.

(21) Appl. No.: 12/836,666

(22) Filed: Jul. 15, 2010

(65) Prior Publication Data
US 2011/0051335 A1   Mar. 3, 2011

(30) Foreign Application Priority Data
Aug. 31, 2009   (CN) .......................... 2009 2 0309306

(51) Int. Cl.
*G06F 1/16*   (2006.01)

(52) U.S. Cl. ..................................... 361/679.01; 49/381
(58) Field of Classification Search .............. 361/679.01
See application file for complete search history.

(56) References Cited

U.S. PATENT DOCUMENTS

| | | | |
|---|---|---|---|
| 2010/0143775 A1* | 6/2010 | Li .................................. 429/96 |
| 2011/0051329 A1* | 3/2011 | Huang ..................... 361/679.01 |
| 2011/0097621 A1* | 4/2011 | He ................................ 429/163 |
| 2011/0173894 A1* | 7/2011 | Ge et al. .......................... 49/381 |

* cited by examiner

*Primary Examiner* — Lisa Lea Edmonds
(74) *Attorney, Agent, or Firm* — Altis Law Group, Inc.

(57) ABSTRACT

A protective cover assembly for portable electronic device includes a housing and a protective cover. The housing defines through holes. Each through hole is bounded by a sidewall. A block extends from the sidewall in each through hole. The protective cover includes tabs. Each plate defines a locking hole to engage a corresponding block.

10 Claims, 3 Drawing Sheets

PROTECTIVE COVER ASSEMBLY FOR ELECTRONIC DEVICE

BACKGROUND

1. Technical Field

The present disclosure relates to protective cover assemblies for electronic devices, particularly, to a protective cover assembly for camera modules used in an electronic device.

2. Description of Related Art

It is common for electronic devices to include a camera mounted within a housing. To prevent moisture or dust from polluting the lens of the camera, a protective cover is generally attached to the housing to cover the lens of the camera. A conventional protective cover includes a main body and a plurality of plates extending from the main body. The housing defines through holes allowing the plates to extend through. The plates of the protective cover are bent after extending through the housing to fix the protective cover to the housing. However, the plates must be bent by a machine, which is complex and takes time.

Therefore, there is room for improvement within the art.

BRIEF DESCRIPTION OF THE DRAWINGS

Many aspects of the protective cover assembly can be better understood with reference to the following drawings. The components in the drawings are not necessarily drawn to scale, the emphasis instead being placed upon clearly illustrating the principles of the protective cover assembly, in which.

DETAILED DESCRIPTION

Figure 1:
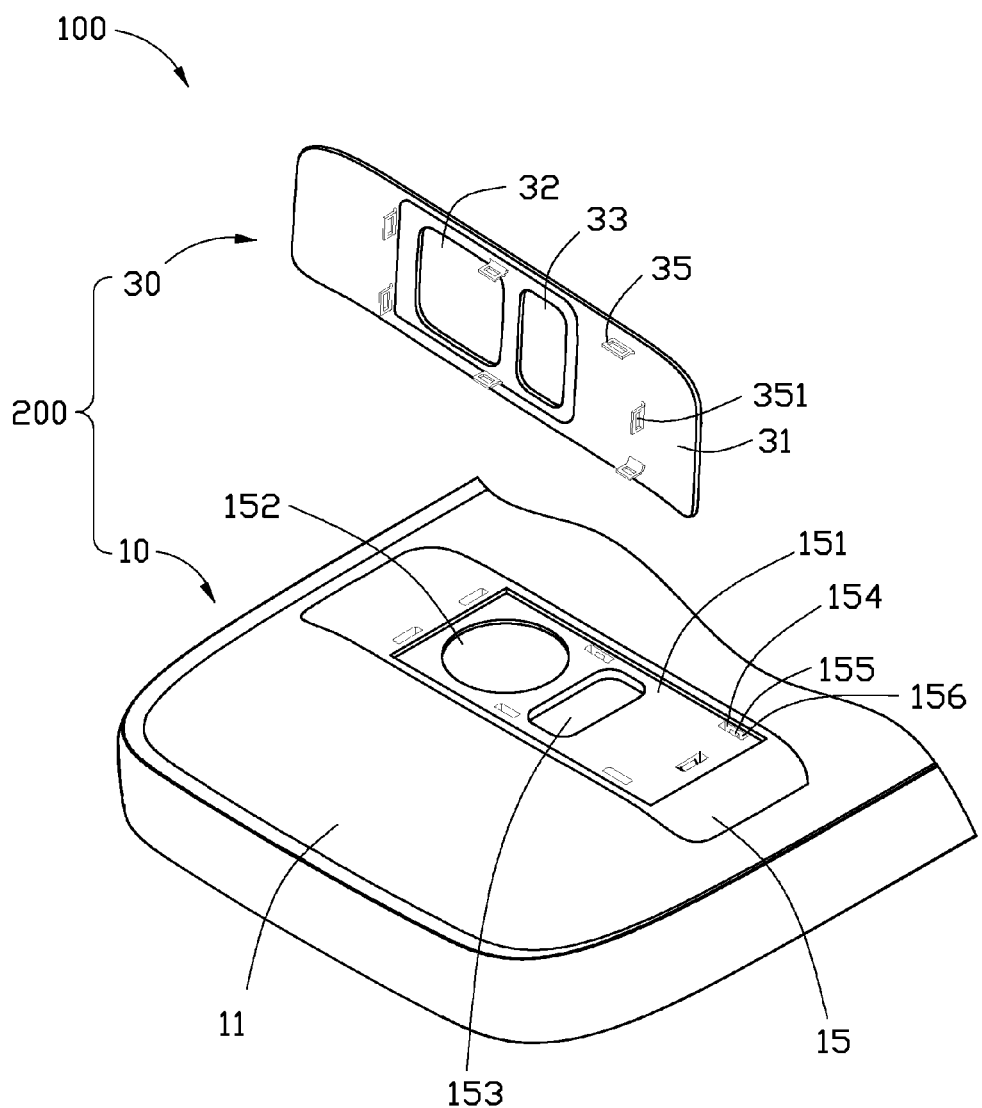
FIG. 1 is an exploded, isometric view of a protective cover assembly for an electronic device, in accordance with an exemplary embodiment.

Referring to FIG. 1, an exemplary protective cover assembly 200 for a camera used in an electronic device 100, such as a mobile phone or a personal digital assistant (PDA), includes a housing 10 and a protective cover 30, in accordance with an exemplary embodiment.

Figure 3:
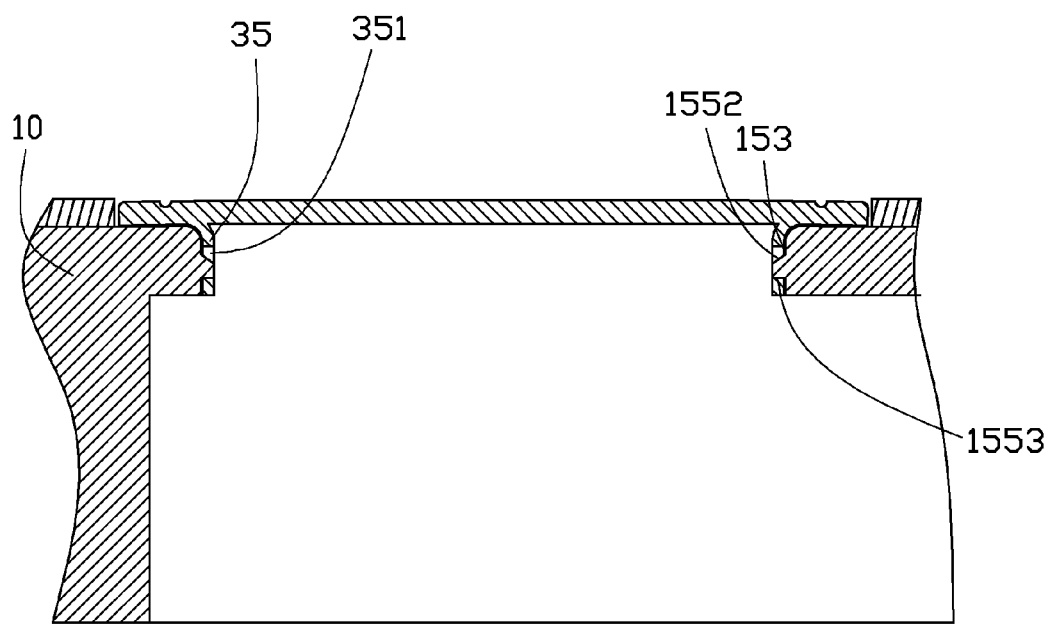
FIG. 3 is a cross-sectional view of the protective cover assembly along line III-III of FIG. 2.

The housing 10 may be a shell or a main body of the electronic device 100. The housing 10 includes a latching portion 15 for fixing the protective cover 30. The latching portion 15 is partially recessed to define a receiving space 151. The latching portion 15 defines a first hole 152, a second hole 153, and a plurality of through holes 154. The first and second holes 152, 153 communicate with the receiving space 151. The first hole 152 allows light from outside to the camera, and the second hole 153 allows light from a camera flash unit (not shown) inside the housing 10 to pass through. The through holes 154 are spacedly positioned. Each through hole 154 is bounded by a sidewall 156. Referring to FIG. 3, a block 155 horizontally protrudes from the sidewall 153 in each through hole 154. The blocks 155 are wedges, and each block 155 includes a sloped top surface 1552 and a bottom surface 1553 perpendicular to the corresponding sidewall 156.

The protective cover 30 includes a first transparent portion 32 corresponding to the first hole 152 and a second transparent portion 33 corresponding to the second hole 153. The protective cover 30 includes an inner surface 31, and a plurality of tabs 35 are integrally formed on the inner surface 31. The positions of the tabs 35 correspond to the through holes 154 of the housing 10, and each of the tabs 35 defines a locking hole 351 to engage the corresponding block 155.

Figure 2:
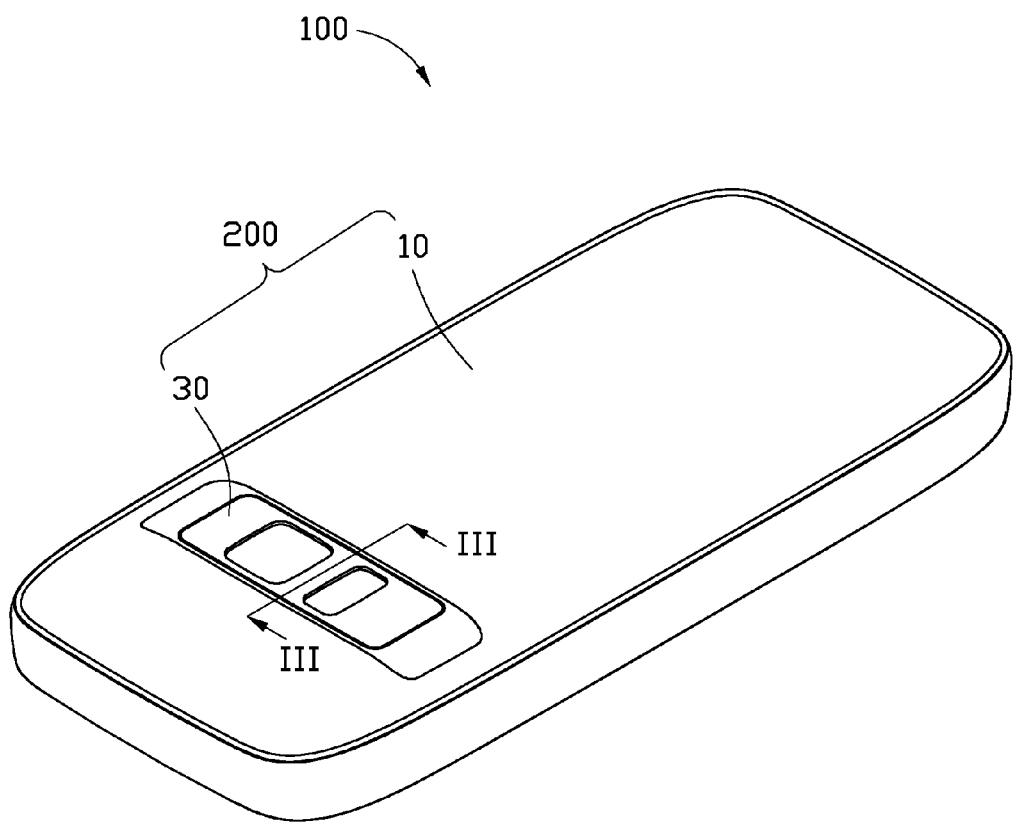
FIG. 2 is an assembled, isometric view of the protective cover assembly shown in FIG. 1.

Referring to FIGS. 2 and 3, to attach the protective cover 30 to the housing 10, the tabs 35 are inserted into the through holes 154 correspondingly. The tabs 35 respectively slide along the sloped top surfaces 1552 and are gradually deformed. When the locking holes 351 are aligned with the blocks 155, the tabs 35 rebound and engage the blocks 155 and are thus locked in the locking holes 351, fixing the protective cover 30 to the housing 10.

It is to be understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A protective cover assembly for electronic device comprising:
    a housing defining a plurality of through holes and forming a plurality of blocks, each block formed in a corresponding through hole; and
    a protective cover including a plurality of tabs, each tab defining a locking hole, the tabs received in the through holes, and the blocks locked in the locking holes correspondingly.

2. The protective cover assembly as claimed in claim 1, wherein the housing defines at least one hole, and the protective cover includes at least one transparent portion corresponding to the at least one hole.

3. The protective cover assembly as claimed in claim 2, wherein the housing defines a first hole and a second hole, and the protective cover includes a first transparent portion corresponding to the first hole and a second transparent portion corresponding to the second hole.

4. The protective cover assembly as claimed in claim 1, wherein the blocks are wedges.

5. The protective cover assembly as claimed in claim 4, wherein each block comprises a sloped top surface and a bottom surface perpendicular to the at least one sidewall.

6. A protective cover assembly for portable electronic device comprising:
    a housing defines a plurality of through holes, each through hole bounded by a sidewall, a block extending from the sidewall in each through hole; and
    a protective cover including a plurality of tabs, the tabs received in the through holes correspondingly, each tab defining a locking hole, the protective cover fixed to the housing by engagement between the blocks and the locking holes.

7. The protective cover assembly as claimed in claim 6, wherein the housing defines at least one hole, and the protective cover includes at least one transparent portion corresponding to the at least one hole.

8. The protective cover assembly as claimed in claim 7, wherein the housing defines a first hole and a second hole, and the protective cover includes a first transparent portion corresponding to the first hole and a second transparent portion corresponding to the second hole.

9. The protective cover assembly as claimed in claim 6, wherein the blocks are wedges.

10. The protective cover assembly as claimed in claim 9, wherein each block comprises a sloped top surface and a bottom surface perpendicular to the sidewall.

* * * * *